(12) United States Patent
Chandrasekaran

(10) Patent No.: US 12,237,189 B2
(45) Date of Patent: Feb. 25, 2025

(54) WAFER STORAGE DEVICES CONFIGURED TO MEASURE PHYSICAL PROPERTIES OF WAFERS STORED THEREIN

(71) Applicant: Micron Technology, Inc., Boise, ID (US)

(72) Inventor: Nagasubramaniyan Chandrasekaran, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 841 days.

(21) Appl. No.: 16/688,238

(22) Filed: Nov. 19, 2019

(65) Prior Publication Data

US 2021/0151338 A1 May 20, 2021

(51) Int. Cl.
*H01L 21/67* (2006.01)
*G01N 21/95* (2006.01)
*H01L 21/66* (2006.01)
*H01L 21/673* (2006.01)
(Continued)

(52) U.S. Cl.
CPC ... *H01L 21/67288* (2013.01); *G01N 21/9501* (2013.01); *H01L 21/67253* (2013.01); *H01L 21/6732* (2013.01); *H01L 21/67383* (2013.01); *H01L 21/67386* (2013.01);
(Continued)

(58) Field of Classification Search
CPC .......... G01N 21/9501; H01L 21/67253; H01L 21/67288; H01L 21/6732; H01L 21/67383; H01L 21/67386; H01L 21/6773; H01L 21/6875; H01L 22/12; H01L 21/67389; H01L 21/67393; H01L 21/67733; H01L 21/67736; H01L 21/67769; A23L 33/105;
(Continued)

(56) References Cited

U.S. PATENT DOCUMENTS 5,354,995 A * 10/1994 Endo ................. H01L 21/67259
250/223 R
10,255,785 B1 4/2019 Huang et al.
10,961,060 B1 * 3/2021 Zhao ..................... B65G 47/68
(Continued)

FOREIGN PATENT DOCUMENTS

CN 203793965 U 8/2014
JP 2005-032907 A 2/2005
TW 201926519 A 7/2019

OTHER PUBLICATIONS

Chinese First Office Action for Chinese Application No. 202011284188. 9, dated Aug. 18, 2023, 24 pages with translation.

*Primary Examiner* — Tri T Ton
(74) *Attorney, Agent, or Firm* — TraskBritt

(57) ABSTRACT

A wafer storage device may include one or more mutually aligned rails extending from two opposing side walls, each pair of mutually aligned rails configured to support a wafer between the side walls. The wafer storage device includes one or more sensors coupled to at least some of the one or more rails. The one or more sensors may be configured to detect a physical property of the wafer. The wafer storage device may further include a processor configured to analyze data from the one or more sensors, and a memory device. The memory device may be configured to store data produced by at least the one or more sensors or the processor. The wafer storage device may also include a power storage device configured to receive power from an external source and supply power to the one or more sensors and the processor.

2 Claims, 7 Drawing Sheets

(51) Int. Cl.
*H01L 21/677* (2006.01)
*H01L 21/687* (2006.01)

(52) U.S. Cl.
CPC ...... *H01L 21/6773* (2013.01); *H01L 21/6875* (2013.01); *H01L 22/12* (2013.01)

(58) Field of Classification Search
CPC ........ A23V 2002/00; A23V 2200/3262; A61K 36/73; A61P 3/06
USPC ...................... 356/237.1–237.6, 239.1–239.8
See application file for complete search history.

(56) References Cited

U.S. PATENT DOCUMENTS

| | | |
|---|---|---|
| 11,282,725 B2 * | 3/2022 | Ehrne .................. H04B 5/0031 |
| 2011/0015773 A1 | 1/2011 | Wilby |
| 2016/0025410 A1 * | 1/2016 | Igarashi .................. H01L 22/12 34/92 |
| 2016/0196966 A1 * | 7/2016 | Yamashita .............. B24B 37/08 451/5 |
| 2018/0048169 A1 | 2/2018 | Bello et al. |
| 2018/0161830 A1 | 6/2018 | Sasaki et al. |
| 2018/0190522 A1 | 7/2018 | Kim et al. |
| 2018/0358249 A1 | 12/2018 | Nagaike |
| 2019/0019699 A1 * | 1/2019 | Aburatani ......... H01L 21/67103 |
| 2019/0067055 A1 | 2/2019 | Zheng et al. |
| 2019/0131152 A1 | 5/2019 | Bae et al. |
| 2019/0131155 A1 | 5/2019 | Bachlechner et al. |
| 2019/0139802 A1 | 5/2019 | Chiu et al. |

* cited by examiner

WAFER STORAGE DEVICES CONFIGURED TO MEASURE PHYSICAL PROPERTIES OF WAFERS STORED THEREIN

TECHNICAL FIELD

Embodiments of the disclosure relate to storage devices and transport devices for microelectronic device wafers. Specifically, some embodiments relate to wafer storage devices and transport devices configured to measure physical properties of microelectronic device wafers stored therein and to related methods and apparatus.

BACKGROUND

During a manufacturing process, microelectronic device (e.g., semiconductor die) wafers (also referred to herein as "wafers") may be transported and stored in a wafer storage device (e.g., wafer transport device, Front Opening Universal Pod (FOUP), Standard Manufacturing Interface (SMIF), etc.). The wafer storage device may be sealed to provide a controlled environment when the wafers are not actively being processed.

During a microelectronic device manufacturing process, wafers may be subjected to multiple process acts, such as adding materials, applying masks, templates, or stencils, removing materials through processes such as grinding, etching, photolithography, etc., and heating processes such as curing and reflow processes.

Each process act employed in a manufacturing process to fabricate microelectronic devices, (e.g., semiconductor dice) from materials of the wafer may affect physical properties of the wafer. For example, adding material may increase a weight and/or thickness of the wafer, whereas material removal processes may result in a reduction in weight and/or a reduction in thickness of the wafer. A heating process and/or curing process may change a shape of the wafer, such as, for example, by causing nonplanarity, such as bowing, dishing, bending or warping of the wafer. Physical changes to the wafer may result in additional stresses in the wafer material and/or potential for damage to the wafer and/or processing equipment. Conventionally, physical changes in a wafer may be selectively measured at intervals during the microelectronic device manufacturing process by one or more additional process acts at measuring stations. The physical changes may be recorded to enable an operator to identify, for example, problems with specific wafers, processes that may need to be modified, and/or faulty equipment or defective or contaminated feedstock used in processing.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

The illustrations presented herein are not meant to be actual views of any particular wafer storage device, wafer processing system, or component thereof, but are merely idealized representations employed to describe illustrative embodiments. The drawings are not necessarily to scale.

As used herein, the term "substantially" in reference to a given parameter means and includes to a degree that one skilled in the art would understand that the given parameter, property, or condition is met with a small degree of variance, such as within acceptable manufacturing tolerances. For example, a parameter that is substantially met may be at least about 90% met, at least about 95% met, at least about 99% met, or even at least about 100% met.

As used herein, relational terms, such as "first," "second," "top," "bottom," etc., are generally used for clarity and convenience in understanding the disclosure and accompanying drawings and do not connote or depend on any specific preference, orientation, or order, except where the context clearly indicates otherwise.

As used herein, the term "and/or" means and includes any and all combinations of one or more of the associated listed items.

As used herein, the terms "physical property" of a wafer and "physical characteristic" a wafer mean and include a quantifiable parameter of the wafer or a portion thereof detectable, measurable, or both, without chemical or metallurgical analysis. For example, weight, thickness and thickness variation, planarity or lack thereof, degree and type of nonplanarity, thickness and nonuniformity of material layers, internal defects including but not limited to, voids in materials, as well as delamination, or peeling of one material with respect to another, are nonlimiting examples of physical properties and physical characteristics of a wafer.

Figure 1:
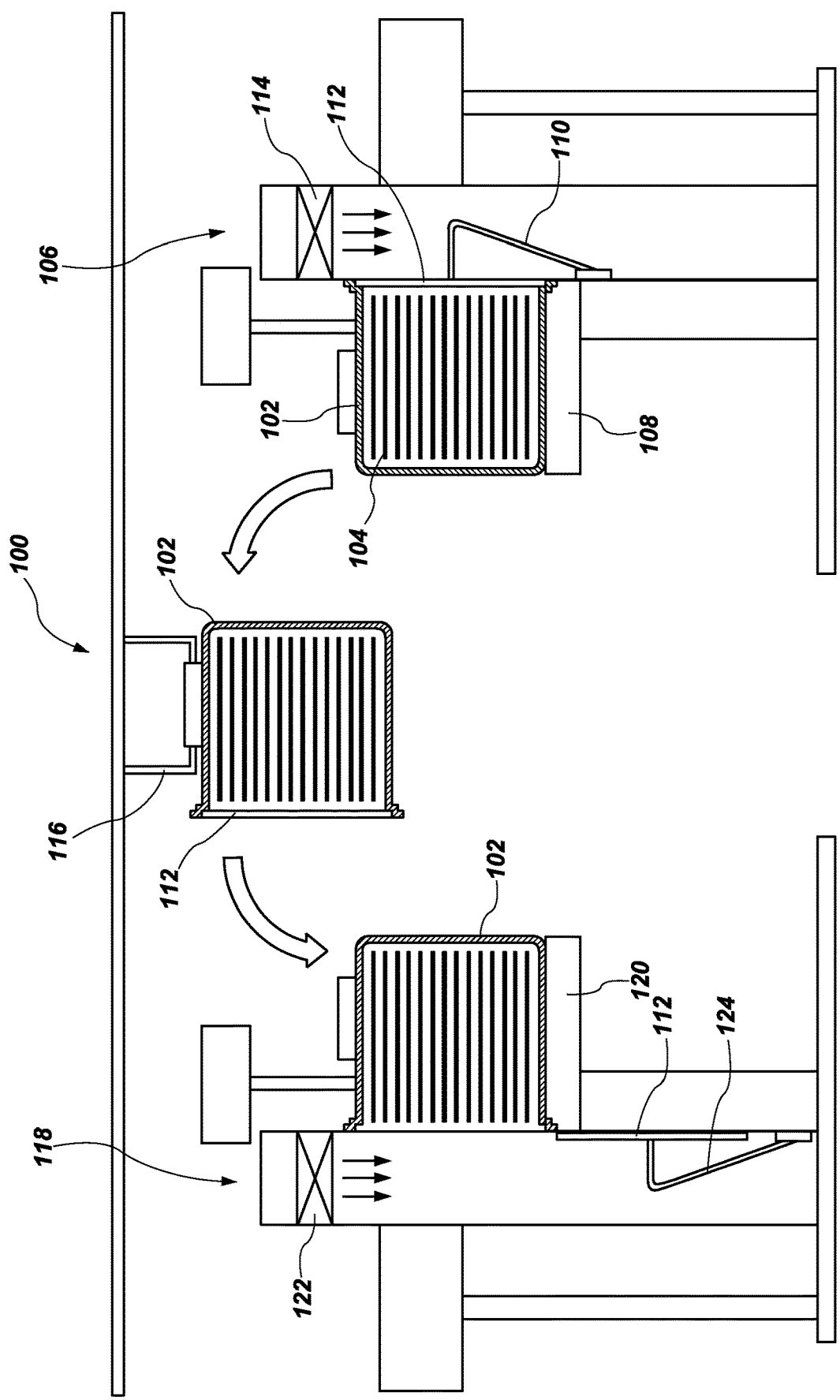
FIG. 1 illustrates a diagrammatic view of a wafer-based microelectronic device fabrication operation in accordance with an embodiment of the present disclosure.

FIG. 1 illustrates a portion of a microelectronic device manufacturing operation 100. Microelectronic devices may be fabricated on wafers through a series of automated process acts at a variety of process stations, also termed "tools" by those of ordinary skill in the art, only two of which are depicted in FIG. 1. Wafers may be stored and transported in a wafer storage device 102 (e.g., wafer transport device, Front Opening Universal Pod (FOUP), Standard Manufacturing Interface (SMIF), etc.) between automated process acts of the fabrication sequence. The wafer storage device 102 may include multiple parallel, laterally separated rails 104 spaced and configured to hold multiple wafers by peripheral edges thereof between pairs of rails 104 in the wafer storage device 102. The pairs of rails 104 may be configured to secure the wafers in mutually spaced, mutually parallel relationship such that the wafers are transported and/or stored without contacting the adjacent wafers in the wafer storage device 102.

The wafer storage device 102 may first be positioned at a first process station 106 where each of the wafers stored in the wafer storage device 102 may be processed. For example, the first process station 106 may be configured for adding material to the wafers, removing material from the wafers, curing the wafers through a heat or chemical process, applying templates and/or stencils to the wafers, etc. The wafer storage device 102 may be secured at the first process station 106 by a first securing apparatus 108. The first securing apparatus 108 may be configured to secure the wafer storage device 102 in a stationary position relative to the first process station 106. The first process station 106 may include a first lid handling apparatus 110 configured to handle a lid 112 of the wafer storage device 102. The first lid handling apparatus 110 may remove the lid 112 from the mouth of wafer storage device 102 when the wafer storage device 102 is secured by the first securing apparatus 108. A first wafer handling apparatus 114 may then remove the wafers one at a time for processing. Once the wafers are processed, individually or as a group, at the first process station 106, the first wafer handling apparatus 114 may place those wafers back in the wafer storage device 102. When all of the wafers have been processed and returned to the wafer storage device 102, the first lid handling apparatus 110 may return the lid 112 to cover the mouth of the wafer storage device 102.

When the lid 112 is secured to the wafer storage device 102, the wafer storage device 102 may be coupled to a transportation apparatus 116. The transportation apparatus 116 may transport the wafer storage device 102 from the first process station 106 to a second process station 118. Once the wafer storage device 102 arrives at the second process station 118, a second securing apparatus 120 may be coupled to the wafer storage device 102. The second securing apparatus 120 may be configured to secure the wafer storage device 102 at the second process station 118 such that the wafer storage device 102 remains substantially stationary with respect to the tooling at the second process station 118. The second process station 118 may include a second lid handling apparatus 124. Once the wafer storage device 102 is secured by the second securing apparatus 120, the second lid handling apparatus 124 may remove the lid 112 from the mouth of wafer storage device 102. A second wafer handling apparatus 122 may individually remove the wafers from the wafer storage device 102 for processing. Once the wafers are processed, individually or as a group, at second process station 118, the second wafer handling apparatus 122 may place those wafers back in the wafer storage device 102. When all of the wafers have been processed and returned the second lid handling apparatus 124 may secure the lid 112 to cover the mouth of the wafer storage device 102. The microelectronic device manufacturing operation 100 may include multiple different processes depending on the type of wafer being processed and the type of microelectronic devices being fabricated.

Figure 2:
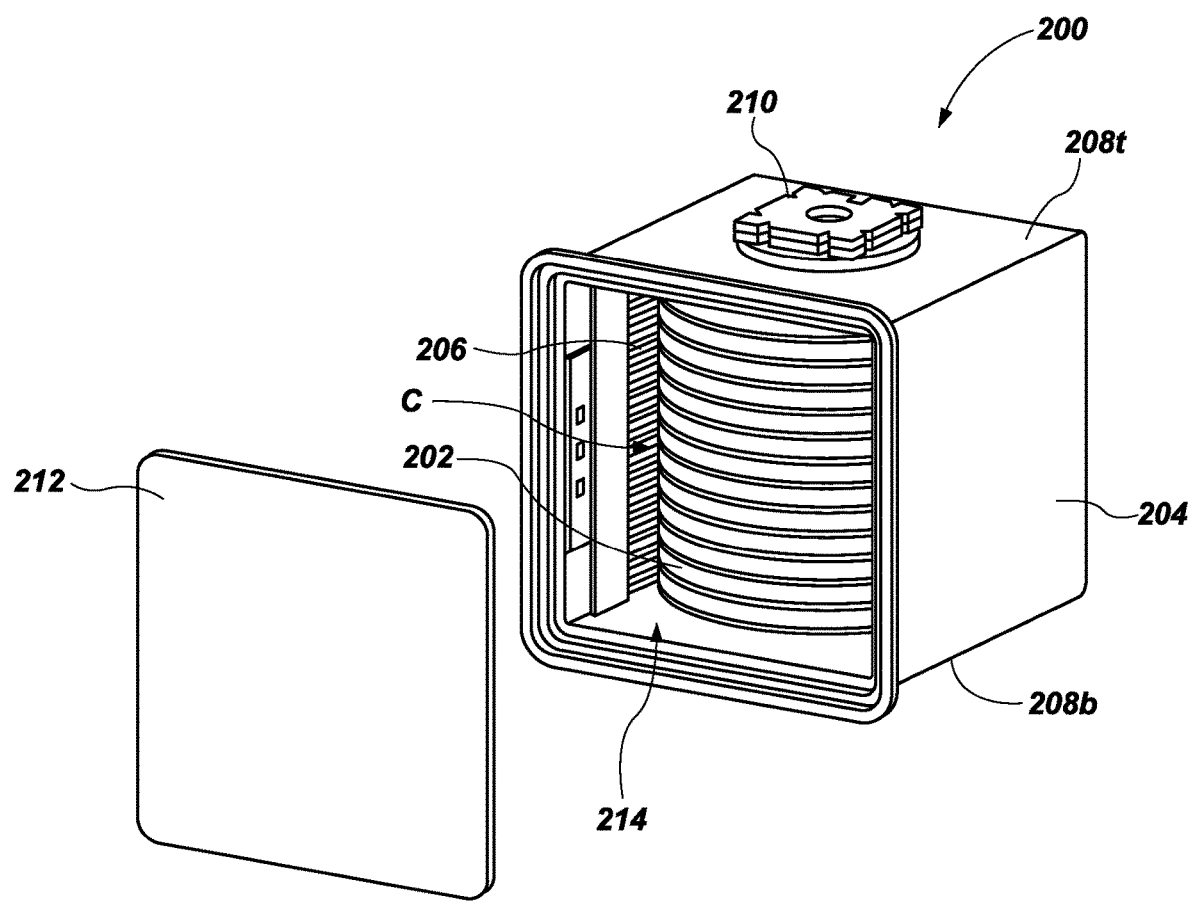
FIG. 2 illustrates an isometric view of a wafer storage device in accordance with an embodiment of the present disclosure.

FIG. 2 illustrates an isometric view of a wafer storage device 200. A wafer storage device 200 may be configured to store wafers 202 for transportation and handling. As described above, during a microelectronic device manufacturing operation the wafers 202 may be moved between process stations in the wafer storage device 200. At each process station, an apparatus may individually and sequentially remove each of the wafers 202 from the wafer storage device 200, so that a process act or acts of that station on the wafer 202 may be performed, and return the wafers 202 to the wafer storage device 200. Each process act may affect (i.e., change) a physical property or characteristic of the wafer 202. For example, the process act may add material to the wafer 202 or remove material from the wafer 202 in a uniform or non-uniform manner.

The wafer storage device 200 may include side walls 204. Each side wall 204 may include one or more rails 206 (e.g., shelves, ridges, protrusions, etc.). The one or more rails 206 may be spaced and configured to support the wafers 202 by peripheral edges thereof separately and in mutually spaced relationship. For example, the wafer storage device 200 may include at least two opposing side walls 204 joined at their rearmost edges by a back wall (not shown). Each of the at least two opposing side walls 204 may include a number of rails 206. The number of rails 206 on each side wall 204 may be the same, and rails 206 on one side wall 204 may be aligned with (i.e., at the same level as) rails 206 on an opposing side wall 204. A wafer 202 may be inserted into the wafer storage device 200 through mouth 214 between adjacent rails 206 such that corresponding rails 206 on each side wall 204 of the wafer storage device 200 are supporting the wafer 202 such that the wafer 202 is oriented in a substantially horizontal (e.g., level) orientation when resting on the one or more rails 206. In some embodiments, the wafer storage device 200 may be configured to hold between about ten wafers 202 and about forty wafers 202. There may be a corresponding number of rails 206 on each side wall 204. Thus the wafer storage device 200 may include between about twenty rails (i.e., ten sets) 206 and about eighty rails 206 (i.e., forty sets) on the side walls 204. For example, if the wafer storage device 200 is sized and configured to hold forty wafers 202 the wafer storage device 200 may include eighty rails 206 with forty rails 206 on each side wall 204.

The wafer storage device 200 may include a top wall 208*t* and a bottom wall 208*b* joining the side walls 204 and the back wall, to form a chamber C having mouth 214. The side walls 204, back wall, top wall 208*t* and bottom wall 208*b* may be configured to protect wafers 202 stored within the chamber C of wafer storage device 200 from damage. For example, protecting surfaces of wafers 202 from unintended contact with tooling, exposure to light (e.g., lasers, ultraviolet light, visible light, etc.), chemicals and other potential contaminants present in the wafer processing environment. In some embodiments, the top wall 208 may include a handle 210 configured to interface with tooling, such as the securing tools and the transportation tools described above.

The wafer storage device 200 may include a lid 212 configured to seal a mouth 214 of the chamber C of wafer storage device 200 when the wafers 202 are not being processed (e.g., interacting with an apparatus at a process station). For example, the lid 212 may secure the wafers 202 during storage, transportation and handling of the wafer storage device 200. In some embodiments, the lid 212 may protect the wafers 202 from unintended contact with tooling, exposure to light, and/or chemicals present in the wafer processing environment. The lid 212 may be removed when the wafer storage device 200 is secured at each process station to allow the apparatus at the process station to access the wafers 202 through the mouth 214 of the wafer storage device 200.

In some conventional microelectronic device manufacturing operations physical characteristics of each wafer 202 may be monitored by conventional techniques. For example, certain physical characteristics of each wafer 202 may be measured and recorded after each processing act. The monitored physical characteristics may include weight, thickness, shape, etc. Microelectronic device manufacturing operations may, conventionally, require an additional act to remove a wafer 202 from a wafer storage device 200, then measure and record the physical characteristics of each wafer 202 and return it to wafer storage device 200. For example, the microelectronic device manufacturing operation may include a weight measurement tool for measuring the weight of each wafer 202. To measure the weight of each wafer 202 the wafer storage device 200 may be transported to the weight measurement tool. Each wafer 202 may then be individually removed from the wafer storage device 200 by a tool or apparatus and placed in the weight measurement tool where the weight of the wafer 202 may be measured and recorded. A similar apparatus may be required to measure each of the other desired physical characteristics of the wafer 202 or a combination of properties measured on a tool as well. To measure the physical characteristics after each processing act may require the wafer storage device 200 to be transported to a respective measurement device between each process station, adding time and expense to each process as well as increasing a risk of wafer contamination or damage. Measuring the physical characteristics of each wafer 202 in this manner may also add a substantial amount of time to the microelectronic device manufacturing operation.

In some microelectronic device manufacturing operations, embodiments of a wafer storage device 200 of the present disclosure may be configured to measure one or more physical characteristics of the wafers 202. Measuring the physical characteristics of the wafers 202 within the wafer storage device 200 may enable the physical characteristic data to be collected during transportation of the wafers 202 from one process station to another process station and eliminate the need to remove wafers from wafer storage device 200 and separate measurement apparatus and acts from the microelectronic device manufacturing operation. Eliminating the need to remove wafers from the wafer storage device 200 to take measurements may decrease the amount of time required to manufacture microelectronic devices.

Some embodiments of the present disclosure may include a wafer storage device. The wafer storage device may include two opposing side walls separated by a top wall, a bottom wall, and a back wall together enclosing a chamber having a mouth. The wafer may further include mutually aligned rails extending from each of the two opposing side walls. The mutually aligned rails may be configured to support a wafer between the opposing side walls. The wafer storage device may also include one or more sensors configured to detect a physical property of a wafer. The one or more sensors may be coupled to at least one rail of the mutually parallel rails.

Another embodiment of the present disclosure may include a wafer processing system. The wafer processing system may include a wafer transport device. The wafer transport device may include a chamber having a mouth and one or more sets of rails extending from two side walls on opposing sides of the chamber. The rails of each set of the one or more sets of rails extending from the two side walls may be spaced to receive and support a wafer between the side walls. The wafer transport device may further include one or more sensors carried by the wafer transport device and configured to measure a weight of at least one wafer.

Another embodiment of the present disclosure may include a method of measuring physical characteristics of a wafer. The method may include positioning a wafer within a wafer storage device. The wafer storage device may comprise a set of mutually aligned rails extending from two opposing side walls. The wafer may be positioned on the set of mutually aligned rails. The method may further include measuring one or more physical characteristics of the wafer with one or more sensors positioned on at least one rail of the set of mutually aligned rails.

Figure 3:
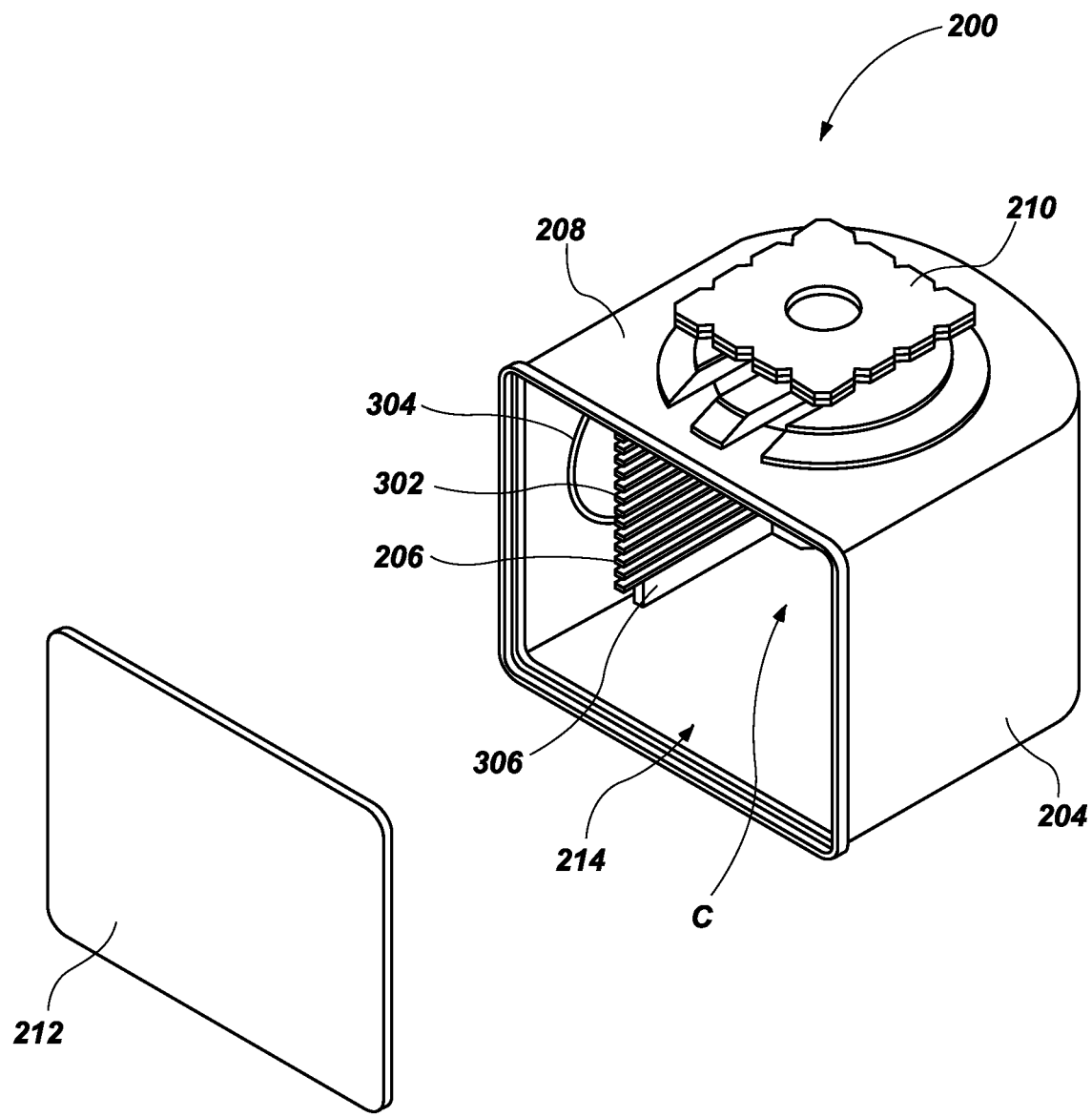
FIG. 3 illustrates an isometric view of a wafer storage device in accordance with another embodiment of the present disclosure.

FIG. 3 illustrates an embodiment of the wafer storage device 200 with the wafers 202 removed. The wafer storage device 200 may include side walls 204 integral with a curve back wall, a top wall 208, a handle 210 extending from the top wall 208, and a lid 212. The rails 206 coupled to the side walls 204 may include one or more sensors 302 coupled to the rails 206. The sensors 302 may be configured to measure one or more physical properties of the wafer 202 associated with the rails 206 to which the sensors 302 are coupled.

For example, the sensors 302 may include force sensors. The force sensors may measure a weight of the wafer 202 that rests on the associated rails 206. In some embodiments, the sensors 302 may be resistance based strain sensors (e.g., piezoresistive sensors) such as strain gauges configured to change a resistance as a weight of the associated wafer 202 increases or decreases. Micro load cells (e.g., capacitive or piezoelectric), or printed circuit force sensors (e.g., Flexi-Force™ sensors from Tekscan™, South Boston, MA) may also be employed The positioning of the sensors 302 on the rails 206 may enable the sensors 302 to detect additional physical properties such as bowing, dishing, bending or warping. For example, two or more force sensors in the form of strain gauges may be placed in longitudinally or laterally spaced relationship on a rail 206. If one of the sensors 302 reads a higher reading than another of the sensors 302 it may indicate warpage in the associated wafer 202 causing an uneven weight distribution.

In some embodiments, the sensors 302 may include an optical sensor, such as an optical ruler, interferometer, time of flight sensor, etc., configured to measure a thickness of the wafer 202. For example, the sensors 302 may include one or more light sources producing light beams such as ultraviolet rays, visible light rays, or infrared rays. The light may reflect off an adjacent surface of the wafer 202 or pass through the wafer 202 and reflect off the opposite side of the wafer 202. A detector may capture the reflected light and determine one or more physical properties of the wafer 202, such as a thickness, a material composition, etc., from the reflected light. The light source (i.e., emitter) and detector (i.e., receiver) may comprise a single device. In some embodiments, the optical sensors may be used to detect abnormalities in the wafer 202. For example, abnormalities detected by the optical sensor may indicate cracks, fractures, air pockets, delaminations, peeling, etc., in the wafer 202. Ultrasonic sensors may also be employed for such applications.

In some embodiments, the rails 206 may include multiple different sensors 302 configured to collect data representative of a variety of physical properties of the wafer 202 on each of the rails 206. The data collected by the sensors 302 may be transferred from the rails 206 through a cable 304. The cable 304 may be coupled to a data storage device such as a memory device (e.g., solid state memory, hard drive, etc.) configured to store the collected data, to a processor configured to compile and perform calculations with the collected data, or both. In some embodiments, the wafer storage device 200 may be configured to transmit the collected data to an external storage device or processor such as a computer, hard drive, server, etc., configured to store and/or process the collected data. In some embodiments, the cable 304 may provide power to each of the sensors 302 from a central power source (not shown) carried by the wafer storage device 200, such as a battery, capacitor, etc. The central power source may be rechargeable, for example while the wafer storage device 200 resides at a process station.

In some embodiments, the wafer storage device 200 may include a base sensor 306 configured to measure physical properties of the wafers 202 stored in the wafer storage device 200 collectively. For example, the base sensor 306 may monitor a collective weight of all the wafers 202 located in the wafer storage device 200. In some embodiments, the rails 206 may be coupled together to comprise a unified, free-standing rail structure adjacent a side wall 204. The rail structure may rest on the base sensor 306 such that the weight of the rail structure and all wafers 202 supported on the individual rails 206 in the rail structure may be measured by the base sensor 306. In some embodiments, the base sensor 306 may be integrated into the handle 210, such that the base sensor 306 is configured to measure a weight of the wafer storage device 200.

In some embodiments, the weight of each individual wafer 202 may be calculated by difference calculations, interpolation, averaging, or other methods. For example, the base sensor 306 may measure a weight of the rail structure or the wafer storage device 200 for tare or calibration purposes before any wafers 202 are inserted into the respective rails 206 and measure a weight of the rail structure or wafer storage device 200 again after one or more (e.g., each) wafers 202 are inserted into the respective rails 206. Similarly, a weight of wafer storage device fully loaded with wafers 202 may be measured, and the weight after each individual wafer 202 is removed, and then again after that wafer is reinserted into wafer storage device 200 to provide a differential weight gain or loss. In each case, the two respective weights may then be processed. In some embodiments, a weight may be measured for the entire rail structure or wafer storage device 200 after all of the wafers 202 have been processed and the weight may then be processed producing an average weight for each wafer 202 in the wafer storage device 200. In some embodiments, the base sensor 306 may measure a weight of the entire rail structure or wafer storage device 200 before or after, or before and after, each wafer 202 having undergone a process act at one or more processing stations is inserted into the wafer storage device 200 and a total weight of the rail structure or wafer storage device 200 may be captured after all of the wafers 202 have been processed. The two sets of weight data may then be combined and/or interpolated to produce a weighted average that may account for differences between each wafer 202.

Figure 4:
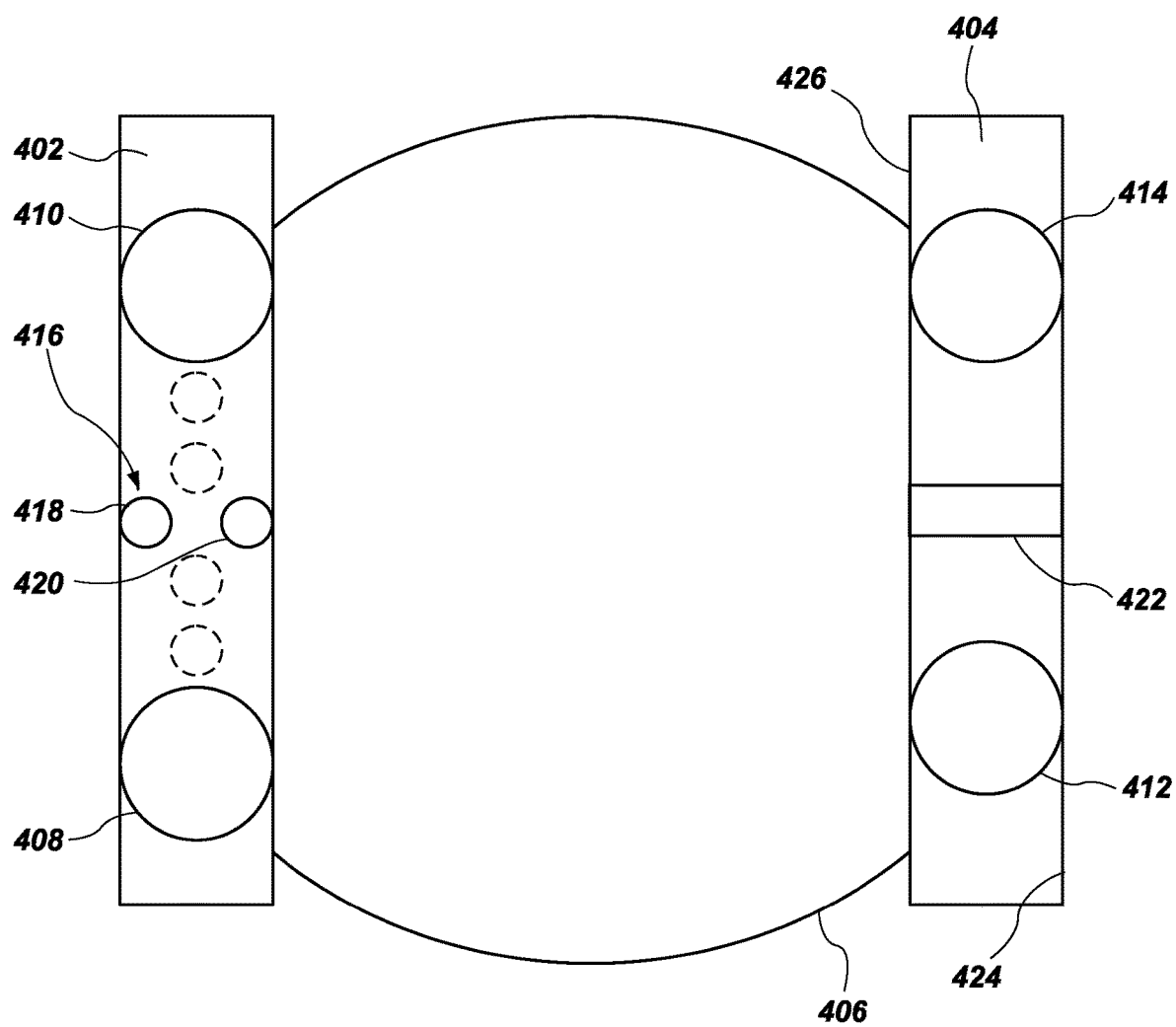
FIG. 4 illustrates a bottom view of lower rails of a set of rails extending from opposing sidewalls of a wafer storage device and configured to support a wafer within the wafer storage device in accordance with an embodiment of the present disclosure.

FIG. 4 illustrates a bottom view of a first rail 402 and a second rail 404 of a wafer storage device supporting a wafer 406. The width of first rail 402 and second rail 404 is exaggerated for illustration purposes, as in practice the rails would not protrude over or under microelectronic device locations (e.g., semiconductor die locations) of the wafer 202. The first rail 402 may include a first weight sensor 408 and a second weight sensor 410. The second rail 404 may include a first weight sensor 412 and a second weight sensor 414 in substantially the same orientation as the first weight sensor 408 and the second weight sensor 410 on the first rail 402. A total weight of the wafer 406 may be calculated by totaling or averaging the weight measurement from each of the first weight sensor 408, second weight sensor 410, first weight sensor 412, and second weight sensor 414.

Throughout the wafer manufacturing operation the weight of the wafer 406 may vary between about 0.05 mg and about 10 g. The weight change from each processing act may be as small as ±0.1 mg or as large as ±2 g. Each of the first weight sensor 408, second weight sensor 410, first weight sensor 412, and second weight sensor 414 may be configured to accurately measure the weight of the wafer 406 at both the lowest potential weight and the highest potential weight of the wafer 406 with sufficient resolution to capture variations, imperfections, and other flaws that may be present after each process. For example, the weight sensors 408, 410, 412, and 414 may have a resolution of between about 0.01 mg and about 0.1 mg, such that a difference of at least 0.1 mg in the weight of the wafer 202 may be detected by the weight sensors 408, 410, 412, and 414. In some embodiments, each of the first weight sensor 408, second weight sensor 410, first weight sensor 412, and second weight sensor 414 may include multiple sensors. For example, each weight sensor 408, 410, 412, and 414 may include a low force sensor configured to measure weights between about 0.01 mg and about 1 mg and capable of detecting differences of between about 0.001 mg. Each weight sensor 408, 410, 412, and 414 may also include a second sensor configured to measure weights between about 1 mg and about 100 mg and capable of detecting differences of about 0.01 mg within that range. In some embodiments, each weight sensor 408, 410, 412, and 414 may further include a third high force sensor configured to measure weights between about 100 mg and about 10 g and capable of detecting differences of between about 1 mg within that range.

In some embodiments, the weight sensors 408, 410, 412, and 414 may include one or more force sensors of the types previously described. For example, the weight sensors 408, 410, 412, and 414 may include an array of resistance based strain sensors. In some embodiments, the array of resistance based strain sensors may be concentrated in the areas identified as the first weight sensor 408, second weight sensor 410, first weight sensor 412, and second weight sensor 414.

In some embodiments, the one or more resistance based strain sensors may be electrically arranged to provide a single electrical signal representing an average resistance of the sensors. For example, the one or more resistance based strain sensors may include at least four resistance based strain sensors electrically arranged in a Wheatstone bridge configuration to average the electrical signal from the resistance based strain sensors. Averaging the electrical signal from the resistance based strain sensors may increase the amount of weight that the resistance based strain sensors can detect in a given location.

In some embodiments, each resistance based sensor may be monitored individually and a processor may evaluate the individual electrical signals to capture information from the individual sensors. In some embodiments, individually monitoring the resistance based strain sensors may increase the resolution of the data received from the resistance based strain sensors. Individually monitoring the resistance based strain sensors may further enable the processor to capture additional data from the resistance based strain sensors. For example, if the resistance based strain sensors do not provide uniform readings the processor may analyze the readings to identify a change in shape of the wafer 406, such as bowing, dishing, bending or warping, defects in the wafer 406, etc. In some embodiments, multiple averaging arrays of resistance based strain sensors may be positioned in different positions along the first rail 402 and the second rail 404 such that each averaging array may be individually monitored. Individually monitoring multiple averaging arrays of resistance based strain sensors may enable the resistance based strain sensors to measure a larger weight while maintaining a high resolution. In some embodiments, individually monitoring multiple averaging arrays of resistance based strain sensors may enable the processor to process data at multiple different positions along the first rail 402 and the second rail 404 and gather additional information as discussed above.

Some embodiments of the present disclosure may include a wafer storage device including one or more rails extending from opposing sidewalls of the wafer storage device. Each of the one or more rails may be configured to support an edge of a wafer. The wafer storage device may further include at least two sensors positioned on each of the one or more rails. A first sensor of the at least two sensors may be positioned adjacent to the sidewall and a second sensor of the at least two sensors may be positioned adjacent an opposite edge of the one or more rails from the sidewall. The wafer storage device may further include a processor configured to process sensor data from the at least two sensors.

Referring again to FIG. 4, in some embodiments, the first rail 402 may include a shape sensor assembly 416. The shape sensor assembly 416 may include an outer shape sensor 418 and an inner shape sensor 420. In some embodiments, the outer shape sensor 418 and the inner shape sensor 420 may be the same type of sensor. For example, the outer shape sensor 418 and the inner shape sensor 420 may both be force sensors. A difference in the force measurement between the outer shape sensor 418 and the inner shape sensor 420 may indicate a change in a physical property of the wafer 406 such as warpage. For example, if the outer shape sensor 418 measures a smaller force than the inner shape sensor 420 it may indicate concave deformation (e.g., dishing or smile deformation) of the wafer 406, as described in further detail below with respect to FIG. 5B. If the outer shape sensor 418 measures a larger force than the inner shape sensor 420, it may indicate convex deformation (e.g., bowing, also termed cry or frown deformation, etc.) of the wafer 406, as described in further detail below with respect to FIG. 5C. In some embodiments, additional shape sensors may be placed along first rail 402 as shown in broken lines to detect warpage of a wafer 406 responsive to variations in contact force.

In some embodiments, each of the outer shape sensor 418 and the inner shape sensor 420 may include a light source and a light detector. The light source may include a laser, an LED, an electron accelerator, etc. The light source may be configured to produce light in the ultraviolet spectrum, the visible spectrum, and/or the infrared spectrum. The light produced by the light source may be reflected by one or more surfaces of the wafer 406. The light detector may detect the reflected light and calculate a distance to the surface by measuring the travel time of the light. Furthermore, the amount of reflected light may indicate other physical properties of the wafer 406, such as a composition of the wafer 406, an angle of the surface of the wafer 406 relative to the sensors, a thickness of the wafer 406, etc. In addition, a light source may be positioned on one rail of a set and a light detector may be positioned on an opposing rail of a set on a sidewall of a wafer storage device 200 in mutually facing relationship. Thus, intensity of light penetrating a wafer 406 may be measured by the light detector, as well as angle of refraction of light penetrating the wafer 406 to be compared against known benchmarks for defect detection purposes.

In some embodiments, the shape sensor assembly 416 may be formed into a sensor array 422. For example, the sensor array 422 may include an array of force sensors arranged transverse to a length of the second rail 404 or in a radial direction relative to the wafer 406, as illustrated in FIG. 4. The sensor array 422 may enable a processor to collect force readings at various intervals between an outer edge 424 and an inner edge 426 of the second rail 404. In some embodiments, the sensor array 422 may include an array of resistance based strain sensors. In some embodiments, the sensor array 422 may include an array of optical sensors or optical sensor components such as light sources or light detectors.

In some embodiments, the first rail 402 may also include a sensor array 422. In some embodiments, the second rail 404 may include a shape sensor assembly 416 including an outer shape sensor 418 and an inner shape sensor 420. For example, both the first rail 402 and the second rail 404 may include a shape sensor assembly 416 including an outer shape sensor 418 and an inner shape sensor 420. In some embodiments, both the first rail 402 and the second rail 404 may include a sensor array 422. In some embodiments, at least one of the first rail 402 and the second rail 404 may include both a shape sensor assembly 416 including an outer shape sensor 418 and an inner shape sensor 420 and a sensor array 422. In some embodiments, one or more of the first rail 402 and the second rail 404 may include more than one sensor array 422 or shape sensor assembly 416. For example, the first rail 402 and/or the second rail 404 may include a sensor array 422 of resistance based strain sensors and a sensor array 422 of optical sensors. In some embodiments, the first rail 402 and/or the second rail 404 may include multiple sensor arrays 422 and/or shape sensor assemblies 416 arranged at different positions along the first rail 402 and/or the second rail 404. The multiple sensor arrays 422 and/or shape sensor assemblies 416 may be configured to measure physical properties of the wafer 406 at different positions along the first rail 402 and/or second rail 404. As noted above, shape sensors may be placed along a rail 402 or 404 to provide an indication of wafer warpage.

Figure 5A:
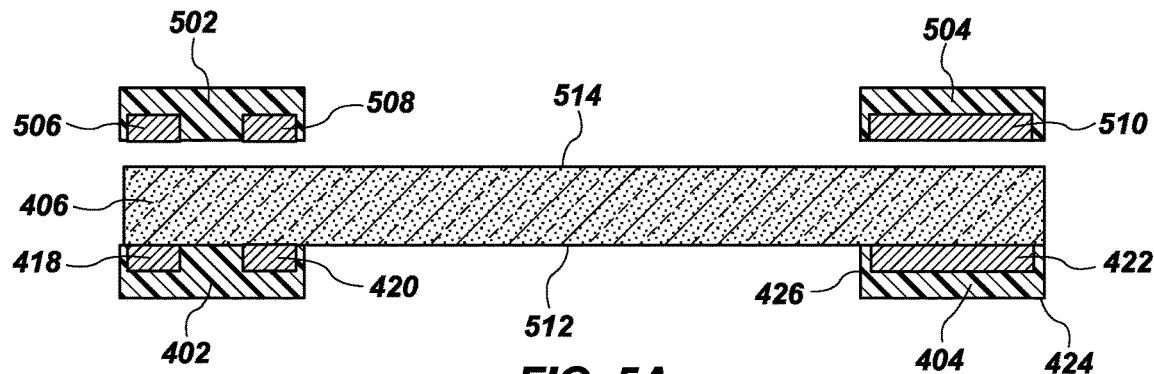
FIG. 5A illustrates a cross-sectional view of upper and lower rails of the set of rails of FIG. 4 extending from opposing sidewalls of a wafer storage device and supporting a wafer.

FIG. 5A illustrates a cross sectional view of the wafer 406 resting on the first rail 402 and the second rail 404, where the cross section is taken along a line passing through the shape sensor assembly 416 and the sensor array 422. The wafer storage device 200 may include multiple sets of rails. A first upper rail 502 and a second upper rail 504 may be directly above the first rail 402 and the second rail 404 respectively. The wafer 406 resting on the first rail 402 and the second rail 404 may be positioned between the first rail 402 and the first upper rail 502 and between the second rail 404 and the second upper rail 504. In some embodiments, the first upper rail 502 and the second upper rail 504 may also support a wafer 406. In some embodiments, the first rail 402 and the second rail 404 may also be positioned above another wafer 406 supported by another set of rails below the first rail 402 and the second rail 404.

The first upper rail 502 and the second upper rail 504 may include sensors directed towards a top (i.e., active) surface 514 of the wafer 406. For example, the first upper rail 502 and the second upper rail 504 may include an upper outer shape sensor 506 and/or an upper inner shape sensor 508. In some embodiments the upper outer shape sensor 506 and the upper inner shape sensor 508 may be complementary to the corresponding outer shape sensor 418 and inner shape sensor 420. For example, the outer shape sensor 418 may be a light source and the upper outer shape sensor 506 may be a light detector. In some embodiments, the outer shape sensor 418 and the corresponding upper outer shape sensor 506 may each include both a light source and a light detector. For example, the outer shape sensor 418 and the upper outer shape sensor 506 may be configured to measure different light at different wavelengths to capture different properties of the wafer 406. In some embodiments, the outer shape sensor 418 and inner shape sensor 420 may be a different type of sensor from the upper outer shape sensor 506 and upper inner shape sensor 508. For example, the outer shape sensor 418 and the inner shape sensor 420 may be force sensors that require contact with the wafer 406 to measure the physical properties of the wafer 406, while the upper outer shape sensor 506 and the upper inner shape sensor 508 may be optical sensors that can measure physical properties of the wafer 406 without contacting the wafer 406.

In some embodiments, a thickness of the wafer 406 may be measured by an optical sensor. The optical sensor may include a light source and a light detector in substantially the same position, such as on the same rail 402, 404, 502, and 504. The thickness of the wafer 406 may be measured by calculating a difference in time between reflections of light from different surfaces of the wafer 406. For example, a first portion of light from the light source may be reflected from a bottom surface 512 of the wafer 406. A second portion of light from the light source may be reflected by the top surface 514 of the wafer 406. The thickness of the wafer 406 may be calculated from the difference in the time between when the light detector receives the reflection of the first portion of light and when the light detector receives the second portion of light. In some embodiments, compositions and thicknesses of different material layers in the wafer 406 may cause additional reflections or refraction at different angles. Therefore, an optical sensor may further detect and/or calculate layer thicknesses of different layers of the wafer 406.

In some embodiments, different types of layers may reflect more or less of the emitted light. The location of different types of layers may result in better measurements from a sensor on the first rail 402 or second rail 404. For example, if a highly reflective layer is included on the top surface 514 of the wafer 406, the information provided by the outer shape sensor 418 on the first rail 402 may include more information than the information provided by the upper outer shape sensor 506. In some embodiments, the information from the opposing sensors such as the outer shape sensor 418 and the upper outer shape sensor 506 may be combined to measure properties of the wafer 406. For example, the measured distance from the outer shape sensor 418 to the bottom surface 512 of the wafer 406 may be combined with the measured distance from the upper outer shape sensor 506 to the top surface 514 of the wafer 406 to calculate a thickness of the wafer 406 or a shape of the wafer 406.

In some embodiments, a composition, thickness, or both of the wafer 406 or levels on the active surface may be measured by optical sensors on the rails 402, 404, 502, and 504. For example, light from the light source may travel at different rates of speed, at different angles, or both, through different materials. In some embodiments, light from a light source on one of the rails 402, 404, 502, and/or 504 may be detected by a complementary light detector on a corresponding rail 402, 404, 502, and/or 504. For example, the outer shape sensor 418 may produce light from its associated light source. The light from the light source of the outer shape sensor 418 may pass through the wafer 406 and be detected by a light detector associated with the upper outer shape sensor 506. The processor may calculate a composition of the wafer 406 with the time required to pass the light from the outer shape sensor 418 to the upper outer shape sensor 506 along with other known parameters such as a distance between the first rail 402 and the first upper rail 502 and a distance between the upper outer shape sensor 506 and the top surface 514 of the wafer 406.

As described above with respect to FIG. 4, the sensors on the first rail 402 and the second rail 404 may be arranged in a sensor array 422. Similarly, the sensors on the first upper rail 502 and the second upper rail 504 may also be arranged in an upper sensor array 510. The upper sensor array 510 may operate in a similar fashion to the upper outer shape sensor 506 and the upper inner shape sensor 508. For example, the upper sensor array 510 may be an array of optical sensors. In some embodiments, the associated light detectors of the upper sensor array 510 may be configured to receive light from a light source associated with the sensor array 422. In some embodiments, the light detectors of the upper sensor array 510 may be configured to receive light from one or more light sources associated with the upper sensor array 510 after the light reflects from a surface or layer of the wafer 406. Similar to the upper outer shape sensor 506 and upper inner shape sensor 508, data from the upper sensor array 510 may allow a processor to calculate physical properties of the wafer 406 such as thickness, shape, composition, layer thickness, etc.

Different processing acts may cause the wafer 406 to warp due to heat cycles, material being added, material being removed, etc. The warpage of the wafer 406 may introduce additional stress into the wafer 406. The wafer 406 may exhibit a threshold amount of warpage where the introduced stresses may be determined to be too high for further processing or handling without remedial measures, such as the use of special chucks to flatten the wafer 406. Further, measuring the amount of warpage in the wafer 406 after each processing act may enable remediation actions to be taken before the wafer 406 reaches the threshold amount of warpage. In some embodiments, an operator may adjust process parameters or design when the monitoring system detects unacceptably large amounts of warpage in multiple wafers during a specific process act, portion of a process act, or after a specific processing act.

In some embodiments, the first rail 402 and the second rail 404, may also include an upper outer shape sensor 506, an upper inner shape sensor 508, and/or an upper sensor array 510 directed toward another set of rails below the first rail 402 and the second rail 404 such that similar measurements may be captured for a wafer 406 supported below the first rail 402 and the second rail 404 on the other set of rails. In some embodiments, the first upper rail 502 and the second upper rail 504 may also include an outer shape sensor 418, inner shape sensor 420, and/or a sensor array 422 directed away from the first rail 402 and the second rail 404, such that similar measurements may be captured for a wafer 406 supported above the first upper rail 502 and the second upper rail 504. In FIGS. 5A through 5D only the sensors associated with the wafer 406 in the figures are shown for clarity of the illustration.

Figure 5B:
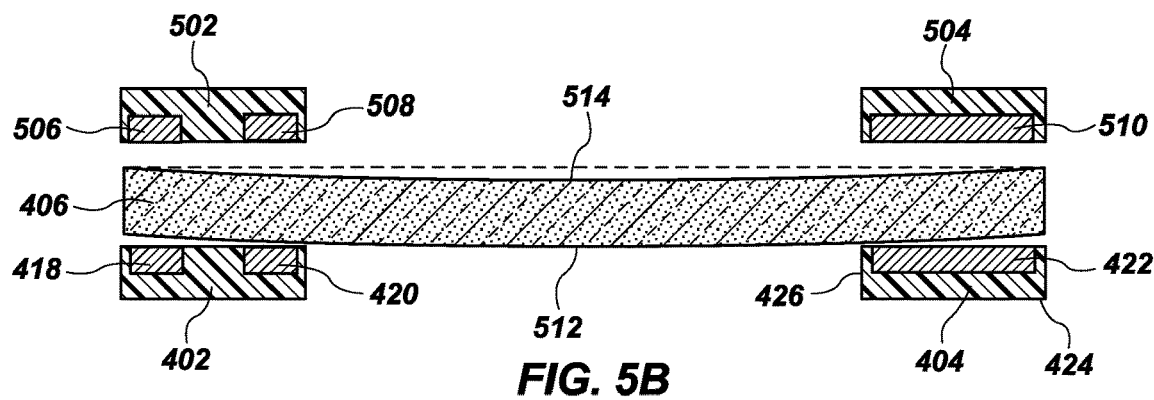
FIG. 5B illustrates a cross-sectional view of upper and lower rails of the set of rails of FIG. 4 extending from opposing sidewalls of a wafer storage device and supporting another, different wafer.

FIG. 5B illustrates a cross sectional view of another wafer 406 resting on the first rail 402 and the second rail 404 where the wafer 406 exhibits dishing (i.e., concavity with respect to a wafer periphery, as shown by the broken line) or bending (i.e., concavity along a linear path). As described above, the outer shape sensor 418 and the inner shape sensor 420 may be sensors that require contact with the wafer 406 such as force sensors or resistance based strain sensors. When the wafer 406 exhibits dishing, the inner shape sensor 420 may measure a significantly larger weight than the outer shape sensor 418. The value of the discrepancy between the outer shape sensor 418 and the inner shape sensor 420 may indicate the amount of dishing of the wafer 406.

In some embodiments, the upper outer shape sensor 506 and the upper inner shape sensor 508 may measure a distance between the respective upper outer shape sensor 506 and upper inner shape sensor 508 and the top surface 514 of the wafer 406. The difference between the distance between the upper outer shape sensor 506 and the top surface 514 of wafer 406 and the distance between the upper inner shape sensor 508 and the top surface 514 of the wafer 406 may indicate the amount of nonplanarity of the wafer 406. In some embodiments, the outer shape sensor 418 and the inner shape sensor 420 may be optical sensors. The outer shape sensor 418 and the inner shape sensor 420 may measure and/or calculate the respective distances between the outer shape sensor 418 and the bottom surface 512 of the wafer 406 and between the inner shape sensor 420 and the bottom surface 512 of the wafer 406. The difference between the distances may indicate an amount of dishing present in the wafer 406.

In some embodiments, nonplanarity may result in a nonuniform thickness of the wafer 406. The distances calculated or measured by the outer shape sensor 418, the inner shape sensor 420, the upper outer shape sensor 506, and the upper inner shape sensor 508 may be used to calculate the thickness of the wafer 406. In some embodiments, the change in thickness may correspond to an angle of the wafer 406 between a region of the inner shape sensor 420 and the upper inner shape sensor 508 and a region of the outer shape sensor 418 and the upper outer shape sensor 506.

In some embodiments, a sensor array 422 and an upper sensor array 510 may provide refined measurements. For example, the sensor array 422 and/or the upper sensor array 510 may each include between two and twenty sensors, such as between about three sensors and about ten sensors arranged in a line between the outer edge 424 of the respective rail 402, 404, 502, and 504 and the inner edge 426 of the respective rail 402, 404, 502, and 504. Thus, where the outer shape sensor 418, the inner shape sensor 420, the upper outer shape sensor 506, and the upper inner shape sensor 508 provide four measurements of the wafer 406 between the respective inner edge 426 and outer edge 424. The combination of the sensor array 422 and the upper sensor array 510 may provide up to forty different measurements of the wafer 406 between the respective outer edge 424 and inner edge 426. The additional measurements of the wafer 406 may provide more accurate calculations regarding properties such as a shape of the wafer 406, and/or a change in thickness of the wafer 406. In some embodiments, both types of measurements may be used. For example, the outer shape sensor 418, inner shape sensor 420, upper outer shape sensor 506, and upper inner shape sensor 508 may enable a threshold determination to be made quickly, such as for generating an alert for an operator or identifying a faulty or damaged wafer. The more refined measurements of the sensor array 422 and upper sensor array 510 may be used to generate logs of the processes on each wafer 406 for modeling, troubleshooting, designing, and/or improving the processes.

Figure 5C:
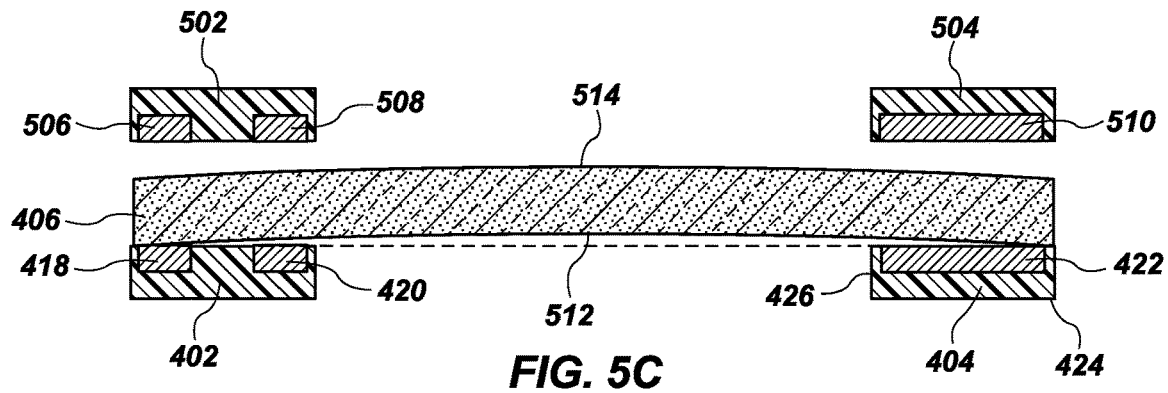
FIG. 5C illustrates a cross-sectional view of upper and lower rails of the set of rails of FIG. 4 extending from opposing sidewalls of a wafer storage device and supporting yet another, different wafer.

FIG. 5C illustrates a cross sectional view of yet another wafer 406 resting on the first rail 402 and the second rail 404 where the wafer 406 is bowed (i.e., convex with respect to a wafer periphery, as shown by the broken line), or bent (i.e., convex with respect to a linear path). As described above, the outer shape sensor 418 and the inner shape sensor 420 may be sensors that require contact with the wafer 406 such as force sensors or resistance based strain sensors. When the wafer 406 bows, the outer shape sensor 418 may measure a significantly larger weight than the inner shape sensor 420. The value of the discrepancy between the outer shape sensor 418 and the inner shape sensor 420 may indicate the amount of bowing of the wafer 406.

As described above, the upper outer shape sensor 506 and the upper inner shape sensor 508 may measure a distance between the respective upper outer shape sensor 506 and upper inner shape sensor 508 and the top surface 514 of the wafer 406. The difference between the distance between the upper outer shape sensor 506 and the top surface 514 of wafer 406 and the distance between the upper inner shape sensor 508 and the top surface 514 of the wafer 406 may indicate the amount of bowing of the wafer 406. In some embodiments, the outer shape sensor 418 and the inner shape sensor 420 may be optical sensors. The outer shape sensor 418 and the inner shape sensor 420 may measure and/or calculate the respective distances between the outer shape sensor 418 and the bottom surface 512 of the wafer 406 and between the inner shape sensor 420 and the bottom surface 512 of the wafer 406. The difference between the distances may indicate an amount of bowing present in the wafer 406.

Figure 5D:
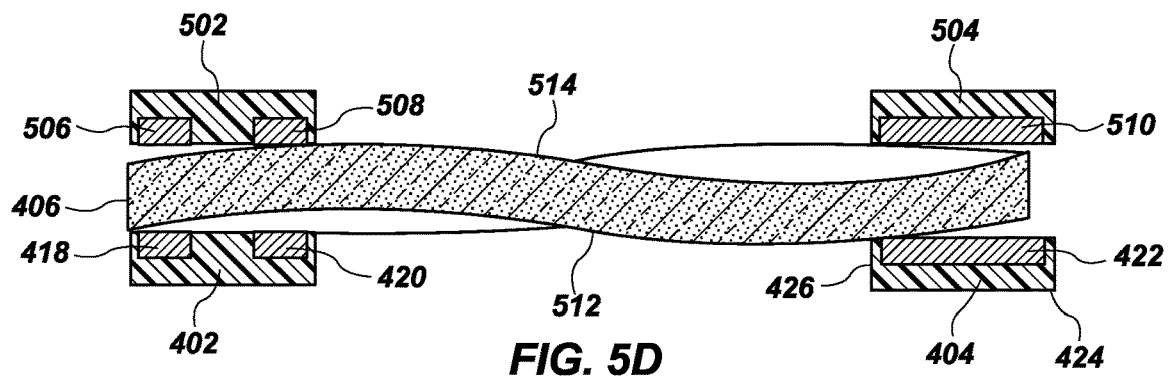
FIG. 5D illustrates a cross-sectional view of upper and lower rails of the set of rails of FIG. 4 extending from opposing sidewalls of a wafer storage device and supporting yet another, different wafer.

FIG. 5D illustrates a cross sectional view of still another wafer 406 resting on the first rail 402 and the second rail 404 where the wafer 406 exhibits warpage (i.e., nonplanarity in opposing directions with respect to a major plane of the wafer), which may also be termed twisting or wrinkling with respect to a major plane of the wafer. As described above, the outer shape sensor 418 and the inner shape sensor 420 may be sensors that require contact with the wafer 406 such as force sensors or resistance based strain sensors. When the wafer 406 warps, the outer shape sensor 418 may measure a significantly larger weight than the inner shape sensor 420 on the first rail 402 and a similarly positioned outer shape sensor 418 and inner shape sensor 420 on the second rail 404 may measure an opposite difference, such as a significantly larger weight on the respective inner shape sensor 420 as compared to the respective outer shape sensor 418. The value of the discrepancy between the respective outer shape sensors 418 and the inner shape sensors 420 may indicate the amount of warpage of the wafer 406. In some embodiments, each of the first rail 402 and the second rail 404 may further include outer shape sensors 418 and inner shape sensors 420 in multiple locations along each rail 402, 404. When the wafer 406 is warped the outer shape sensors 418 and inner shape sensors 420 along each rail 402, 404 may exhibit different degrees of variation along the respective rails 402, 404. For example, in a first location along the first rail 402 the respective outer shape sensor 418 may measure a significantly larger weight than the respective inner shape sensor 420 and at a second location along the first rail 402 a second respective outer shape sensor 418 may measure a significantly smaller weight than the respective second inner shape sensor 420.

In some embodiments, at least one of the first rail 402 and the second rail 404 may include multiple sensor arrays 422 arranged along the respective rail 402, 404. As described above, the sensor arrays 422 may measure differences between an outer portion of each respective sensor array 422 and an inner portion of each respective sensor array 422. If a magnitude of the difference between the inner and outer portions of each respective sensor array 422 changes along the respective rail 402, 404, the change in magnitude may indicate that the wafer 406 is warped. In some embodiments, the sensor arrays 422 may return a single measurement for each array. If the sensor arrays 422 measure significantly different weights along the respective rail 402, 404, the weight discrepancies may indicate that the wafer 406 is warped.

As described above, the upper outer shape sensor 506 and the upper inner shape sensor 508 may measure a distance between the respective upper outer shape sensor 506 and upper inner shape sensor 508 and the top surface 514 of the wafer 406. The difference between the distance between the upper outer shape sensor 506 and the top surface 514 of wafer 406 and the distance between the upper inner shape sensor 508 and the top surface 514 of the wafer 406 may indicate the amount of warpage of the wafer 406. In some embodiments, the outer shape sensor 418 and the inner shape sensor 420 may be optical sensors. The outer shape sensor 418 and the inner shape sensor 420 may measure and/or calculate the respective distances between the outer shape sensor 418 and the bottom surface 512 of the wafer 406 and between the inner shape sensor 420 and the bottom surface 512 of the wafer 406. The difference between the distances may indicate an amount of warpage present in the wafer 406.

In some embodiments, wafer nonplanarity may result in a non-uniform thickness of the wafer 406. The distances calculated or measured by the outer shape sensor 418, the inner shape sensor 420, the upper outer shape sensor 506, and the upper inner shape sensor 508 may be used to calculate the thickness of the wafer 406. In some embodiments, the change in thickness may correspond to an angle of the wafer 406 between a region of the inner shape sensor 420 and the upper inner shape sensor 508 and a region of the outer shape sensor 418 and the upper outer shape sensor 506.

Some embodiments of the present disclosure may include a wafer storage device. The wafer storage device may include one or more rails extending in alignment from opposing side walls of the wafer storage device. The one or more rails may be spaced and configured, in combination, to support a wafer within a chamber of the wafer storage device. The wafer storage device may further include a sensor array positioned along one or both rails of each set of aligned rails in a direction substantially parallel to the sidewall. The sensor array may be configured to measure at least one physical property of a wafer supported on each respective set of rails.

Figure 6:
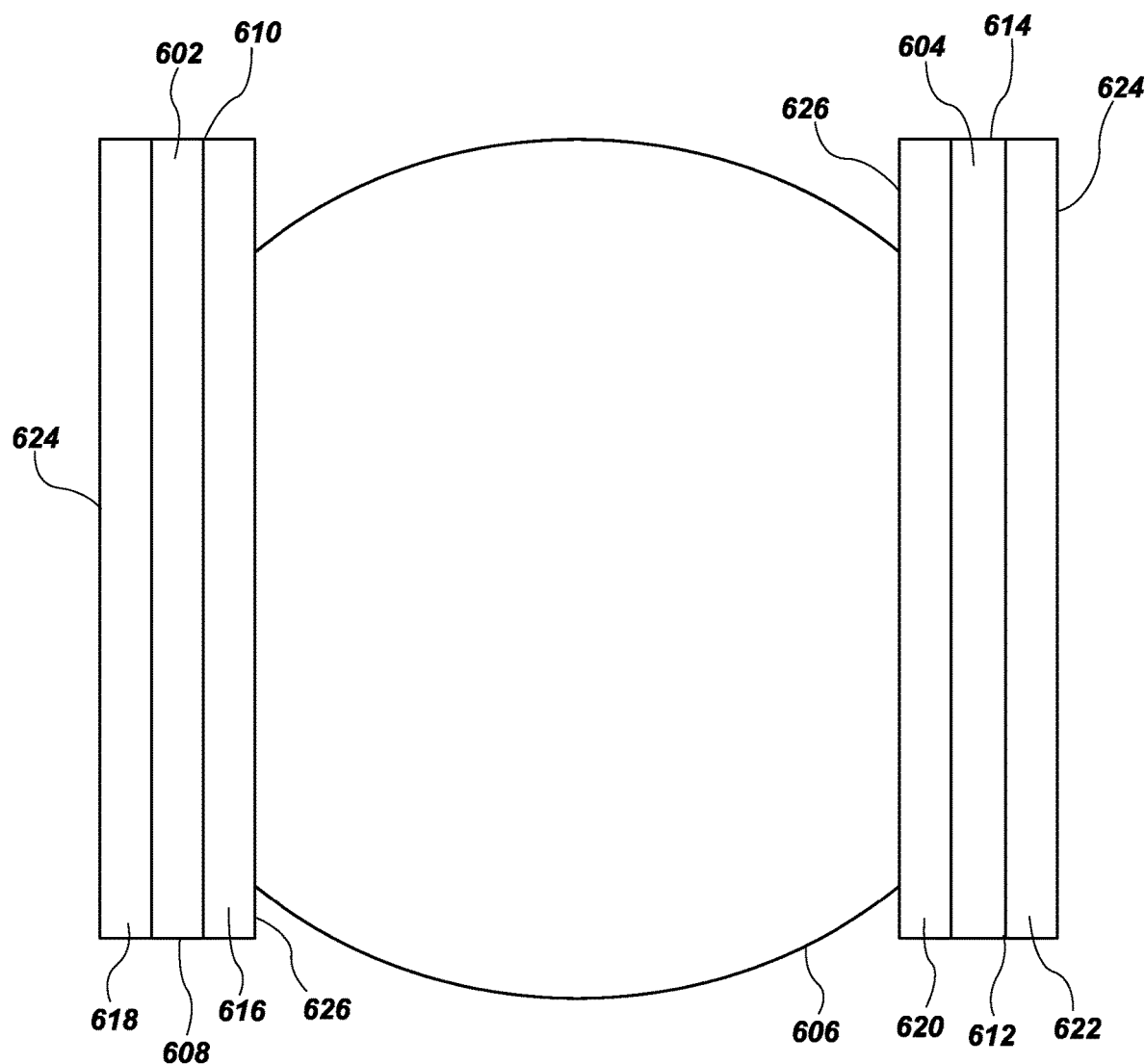
FIG. 6 illustrates a bottom view of a set of rails configured to support a wafer in accordance with an embodiment of the present disclosure.

FIG. 6 illustrates a bottom view of a first rail 602 and a second rail 604 supporting a wafer 606. As in the case of FIG. 4, the width of first rail 602 and second rail 604 is exaggerated for clarity of illustration. The first rail 602 may include one or more arrays of sensors extending from a first end 608 of the first rail 602 to a second end 610 of the first rail 602. The second rail 604 may also include one or more arrays of sensors extending from a first end 612 of the second rail 604 to a second end 614 of the second rail 604.

For example, the first rail 602 may include a first inner sensor array 616 extending from the first end 608 to the second end 610. The first inner sensor array 616 may be substantially linear along an inner edge 626 of the first rail 602. In some embodiments, the first inner sensor array 616 may be an array of evenly spaced force sensors. In some embodiments, the first inner sensor array 616 may be an array of resistance based strain sensors. In some embodiments, the first inner sensor array 616 may be an array of optical sensors. The first rail 602 may also include a first outer sensor array 618 extending from the first end 608 to the second end 610. The first outer sensor array 618 may be substantially linear and extend along an outer edge 624 of the first rail 602. In some embodiments, the first outer sensor array 618 may be an array of evenly spaced force sensors. In some embodiments, the first outer sensor array 618 may be an array of resistance based strain sensors. In some embodiments, the first outer sensor array 618 may be an array of optical sensors. In some embodiments, the first inner sensor array 616 and the first outer sensor array 618 may be arrays of the same type of sensors. In some embodiments, the first inner sensor array 616 may be a different type of sensor from the first outer sensor array 618. For example, the first inner sensor array 616 may be an array of resistance based strain sensors and the first outer sensor array 618 may be an array of optical sensor. In another embodiments, the first inner sensor array 616 may be an array of force sensors and the first outer sensor array 618 may be an array of resistance based strain sensors.

The second rail 604 may also include a second inner sensor array 620 extending from the first end 612 to the second end 614. The second inner sensor array 620 may be substantially linear and extend along an inner edge 626 of the second rail 604. The second rail 604 may also include a second outer sensor array 622 extending from the first end 612 to the second end 614. The second outer sensor array 622 may also be substantially linear and extend along an outer edge 624 of the second rail 604. The second inner sensor array 620 and the second outer sensor array 622 may be arrays of sensors selected from force sensors, resistance based strain sensors, and optical sensors.

In some embodiments, the first rail 602 and the second rail 604 may each include a single sensor array on each rail 602, 604. In some embodiments, the first rail 602 and the second rail 604 may include multiple intermediate sensor arrays between the respective first inner sensor array 616 and the first outer sensor array 618 and between the second inner sensor array 620 and the second outer sensor array 622. In some embodiments, the first outer sensor array 618 and/or second outer sensor array 622 may not extend from the respective first end 608, 612 to the respective second end 610, 614. Accordingly, the first outer sensor array 618 and second outer sensor array 622 may be positioned over a central portion of the respective first rail 602 and second rail 604 where the wafer 606 is in contact with the first rail 602 and the second rail 604.

The first inner sensor array 616, first outer sensor array 618, second inner sensor array 620, and second outer sensor array 622 may be used to measure and/or calculate different physical properties of the wafer 606. For example, the first inner sensor array 616, first outer sensor array 618, second inner sensor array 620, and second outer sensor array 622 may measure a weight of the wafer 606, a thickness of the wafer 606, and/or a shape of the wafer 606. In some embodiments, differences between the readings of sensors in the first inner sensor array 616 and the first outer sensor array 618 may be used to calculate different properties of the wafer 606 such as nonplanarity or changes in thickness. Differences between the readings of the second inner sensor array 620 and the second outer sensor array 622 may similarly be used to calculate properties of the wafer 606.

Some embodiments of the present disclosure may include a wafer transport device. The wafer transport device may include one or more pairs of mutually aligned shelves extending from two opposing side walls. The mutually aligned shelves may be configured to support a wafer between the two opposing side walls. The wafer transport device may further include one or more sensors positioned on at least one shelf of at least some pairs of mutually aligned shelves. The wafer transport device may also include a processor operably coupleable to receive signals comprising data from the one or more sensors. The wafer transport device may further include a memory device configured to store data from the one or more sensors. The wafer transport device may also include a power storage device configured to receive and store power from an external source and supply power to the one or more sensors, the processor and the memory.

Figure 7:
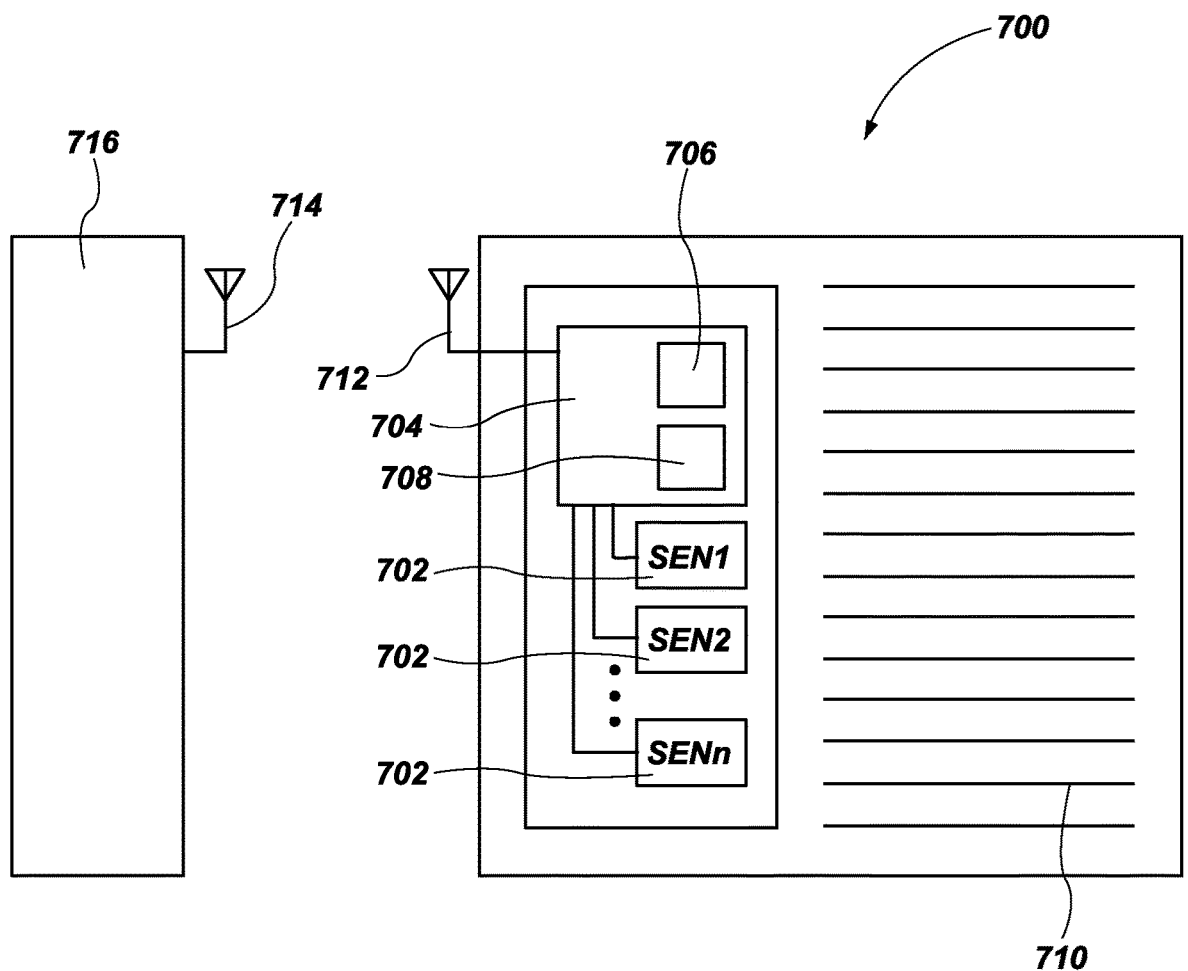
FIG. 7 illustrates a schematic view of a wafer storage device 700 in accordance with an embodiment of the present disclosure.

FIG. 7 illustrates a schematic view of a wafer storage device 700. The wafer storage device 700 may include multiple sensors 702 as described hereinabove. The sensors 702 may be connected to a processor 704. The processor 704 may have an associated memory device 706 and power storage device 708. The sensors 702 may be located on individual rails 710 in the wafer storage device 700. As discussed above, the sensors 702 may include force sensors, resistance based strain sensors, and optical sensors. In some embodiments, the wafer storage device 700 may also include environmental sensors such as humidity sensors, temperature sensors, air quality sensors, etc. The sensors 702 may receive power from the power storage device 708 and transmit the sensor readings to the processor 704. The sensor readings may be stored in the memory device 706, transmitted to external equipment, or both. In some embodiments, the processor 704 may process the sensor readings and/or perform calculations based on the sensor readings. In some embodiments, the processor may receive and transmit the sensor readings to external equipment without storing the sensor readings. For example, the processor may broadcast the sensor readings wirelessly, such that a receiver in the external equipment may receive the sensor readings in real-time and process the sensor readings in the external equipment.

In some embodiments, the power storage device 708 may not include a processor. For example, the power storage device 708 may provide power to the sensors 702. The sensors 702 may wirelessly transmit the sensor readings to the external equipment where a receiver and processor may receive and process the sensor readings. In some embodiments, the sensors 702 may include a processor and/or memory storage device configured to store and/or process sensor readings before transmitting the sensor readings to the external equipment. In some embodiments, the sensors 702 may not include a processor or memory storage device and may transmit the sensor readings to the external equipment in real-time. In some embodiments, each sensor 702 may include its own individual power storage device 708. Each sensor 702 may be wirelessly coupled to a wireless receiver configured to receive the sensor readings. In some embodiments, the wireless receiver may be positioned within the wafer storage device 700. In some embodiments, the wireless receiver may be positioned in the external equipment.

In some embodiments, the power storage device 708 may be a single main rechargeable battery configured to store enough power to power all of the individual sensors 702 and the processor in the wafer storage device 700 when there is not external power available. A single main battery may reduce space requirements of the sensors 702 and enable the wafer storage device 700 to include more sensors 702 without reducing the number of wafers that the wafer storage device 700 may store.

The wafer storage device 700 may include a device connector 712 that may provide an external connection for the processor 704 and/or the power storage device 708. The device connector 712 may be configured to connect to a tool connector 714 for a tool 716 in a wafer manufacturing operation. The tool connector 714 may supply power to the power storage device 708 when the tool 716 is couple to the wafer storage device 700. The tool 716 may be coupled to the wafer storage device 700 when the wafer storage device 700 is transporting the wafers between processes. For example, the tool 716 may be used to transport the wafer storage device 700 between processes. In some embodiments, a tool 716 may be coupled to the wafer storage device 700 to secure the wafer storage device 700 at each process station. The tool connector 714 may provide power to the power storage device 708, maintaining a charge of the power storage device 708 when the tool 716 is coupled to the wafer storage device 700. The power storage device 708 may supply constant power to the sensors 702 and the processor 704 at all times. For example, if the tool 716 is not coupled to the wafer storage device 700 the power storage device 708 may supply power to the sensors 702 and the processor 704. When the tool 716 is coupled to the wafer storage device 700 the tool connector 714 may supply power to the power storage device 708 to replenish the charge expelled during the time when the tool 716 was not coupled to the wafer storage device 700. The power storage device 708 may continue to supply power to the sensors 702 and processor 704 when the tool 716 is coupled to the wafer storage device 700, such that the power delivered to the sensors 702 and the processor 704 is constant and uninterrupted.

In some embodiments, the tool connector 714 may provide a data connection. For example, the tool connector 714 may enable the processor 704 to transfer data from the memory device 706 of the processor 704 to an external data storage device. The external data storage device may include a computer, a hard drive, a server, a tablet, an operation management system, etc. In some embodiments, the processor 704 may transfer data directly from the sensors 702 to the external data storage device. In some embodiments, the external data storage device may store data from multiple operations.

The external data storage device may use the data to generate historical logs of the wafer manufacturing operation for comparisons between individual wafers. For example, data for an individual wafer may be compared against the historical data to identify wafers that are outside normal parameters at any point during the operation. Wafers that are outside normal parameters may be identified and pulled for inspection, testing, and remediation if possible. In some embodiments, the historical data may be used by an operator to perform diagnostics on the wafer manufacturing operation and/or the associated tooling. For example, if multiple wafers are identified as being outside normal parameters after a specific processing step, an operator may request an inspection and/or repair of the tooling associated with the processing act.

In some embodiments, the data may be used by an engineer to model the effects on a similar wafer after particular processes. For example, the data may be used to generate models enabling an engineer designing a process to predict behavior of a wafer in another similar process. In some embodiments, the data may identify processes in the wafer manufacturing operation that may require a modification to achieve improved results, such as less warpage, less wasted material, etc.

Embodiments of the present disclosure may reduce the amount of time required to manufacture a microelectronic device. For example, embodiments of the present disclosure may enable such a manufacturing process to eliminate additional acts used to take physical measurements of the wafers. The elimination of conventional measurement acts may further enable such a manufacturing operation to eliminate the tooling associated with the measurement acts. Some of the tooling associated with the measurement acts may be expensive and its elimination may substantially reduce the costs of manufacturing the microelectronic devices, as well as processing time.

Some embodiments of the present disclosure may enable a microelectronic device manufacturing operation to capture more data for each wafer. The additional data may enable an operator to identify problems with a wafer or process act earlier, better model the effects of each process act on the wafers, and/or identify processes that may need to be modified.

The embodiments of the disclosure described above and illustrated in the accompanying drawings do not limit the scope of the disclosure, which is encompassed by the scope of the appended claims and their legal equivalents. Any equivalent embodiments are within the scope of this disclosure. Indeed, various modifications of the disclosure, in addition to those shown and described herein, such as alternative useful combinations of the elements described, will become apparent to those skilled in the art from the description. Such modifications and embodiments also fall within the scope of the appended claims and equivalents.

What is claimed is:

1. A wafer storage device comprising:
one or more mutually aligned rails having a top surface and a bottom surface, the one or more mutually aligned rails extending in alignment from opposing side walls of the wafer storage device,
the opposing side walls separated by a top wall, a bottom wall, and a back wall together enclosing a chamber having a mouth, wherein the one or more mutually aligned rails are spaced and configured, in combination, to support a wafer within the chamber of the wafer storage device,
the top surface of the one or more mutually aligned rails positioned a first distance from the top wall of the wafer storage device, and
the bottom surface of the one or more mutually aligned rails positioned a second distance, greater than the first distance, from the top wall of the wafer storage device; and
a sensor array positioned along one or both rails of each set of mutually aligned rails in a direction substantially parallel to the side wall, wherein at least one sensor of the sensor array is positioned on a bottom surface of the set of mutually aligned rails;
wherein the sensor array is configured to measure at least one physical property of a wafer supported on each respective set of rails and wherein the at least one sensor positioned on the bottom surface of the set of mutually aligned rails is configured to measure at least one physical property of a second wafer supported on a set of rails positioned beneath the respective set of rails.

2. The wafer storage device of claim 1, wherein the sensor array is positioned along an inner edge of a respective rail, and further comprising a second sensor array positioned along an outer edge of the respective rail adjacent to the side wall.

* * * * *